United States Patent
Hegde et al.

(10) Patent No.: US 11,043,454 B2
(45) Date of Patent: Jun. 22, 2021

(54) LOW RESISTIVITY INTERCONNECTS WITH DOPED BARRIER LAYER FOR INTEGRATED CIRCUITS

(71) Applicant: Samsung Electronics Co., Ltd., Suwon-si (KR)

(72) Inventors: Ganesh Hegde, Houston, TX (US); Harsono S. Simka, Saratoga, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/410,787

(22) Filed: May 13, 2019

(65) Prior Publication Data

US 2020/0235055 A1    Jul. 23, 2020

Related U.S. Application Data

(60) Provisional application No. 62/793,766, filed on Jan. 17, 2019.

(51) Int. Cl.
*H01L 23/532*    (2006.01)
*H01L 21/768*    (2006.01)

(52) U.S. Cl.
CPC .. *H01L 23/53266* (2013.01); *H01L 21/76843* (2013.01); *H01L 23/53238* (2013.01)

(58) Field of Classification Search
CPC ................................................ H01L 23/53266
USPC ........................................................ 257/751
See application file for complete search history.

(56) References Cited

U.S. PATENT DOCUMENTS

| | | | |
|---|---|---|---|
| 6,016,012 A | 1/2000 | Chatila et al. |
| 6,297,146 B1 | 10/2001 | Lopatin |
| 6,509,267 B1 | 1/2003 | Woo et al. |
| 6,555,461 B1 | 4/2003 | Woo et al. |
| 6,680,540 B2 | 1/2004 | Nakano et al. |
| 6,861,349 B1 | 3/2005 | Lopatin et al. |
| 7,473,637 B2 | 1/2009 | Kraus et al. |
| 7,808,106 B1 | 10/2010 | Eisenbraun |
| 8,486,832 B2 | 7/2013 | Morinaga et al. |
| 9,245,794 B2 | 1/2016 | Yang et al. |
| 2002/0142531 A1 | 10/2002 | Hsu et al. |

(Continued)

OTHER PUBLICATIONS

Fang, J.S., et al., Low-Resistivity Ru—Ta—C Barriers for Cu Interconnects, Journal of Electronic Materials, vol. 41, No. 1, 2012, 6 pages.

(Continued)

*Primary Examiner* — Ajay Arora
(74) *Attorney, Agent, or Firm* — Lewis Roca Rothgerber Christie LLP

(57) ABSTRACT

A method of forming an interconnect for an integrated circuit includes: identifying an interconnect barrier material, identifying a plurality of potential dopant elements, creating an ensemble of potential barrier structures including the interconnect barrier material doped at a plurality of doping positions and a plurality of doping amounts for each of the plurality of potential dopant elements, calculating a density of states for each of the barrier structures of the ensemble, selecting a dopant element and a doping amount based on the density of states, and depositing a barrier layer including an alloy, the alloy including the interconnect barrier material and the selected dopant element at the selected doping amount.

8 Claims, 6 Drawing Sheets

(56) References Cited

U.S. PATENT DOCUMENTS

| | | | |
|---|---|---|---|
| 2005/0161817 A1* | 7/2005 | Meyer | H01L 21/76846 |
| | | | 257/751 |
| 2005/0272254 A1 | 12/2005 | Ding et al. | |
| 2005/0277292 A1 | 12/2005 | Peng et al. | |
| 2007/0059502 A1 | 3/2007 | Wang et al. | |
| 2017/0033003 A1* | 2/2017 | Song | H01L 23/53266 |
| 2018/0301373 A1 | 10/2018 | Yashar et al. | |

OTHER PUBLICATIONS

Yu-Chen Chan, et al. "Low-via-resistance and low-cost PVD-TiZrN barrier for Cu/low-K interconnects", IEEE (IITC), 2016, pp. 174-176, Taiwan Semiconductor Manufacturing Co, Ltd.

* cited by examiner

LOW RESISTIVITY INTERCONNECTS WITH DOPED BARRIER LAYER FOR INTEGRATED CIRCUITS

CROSS-REFERENCE TO RELATED APPLICATION

The present application claims priority to and the benefit of U.S. Provisional Application No. 62/793,766, entitled "LOW RESISTIVITY INTERCONNECT BARRIER FORMED BY ALLOYING TO INCREASE DENSITY OF STATES", filed on Jan. 17, 2019, the entire content of which is incorporated herein by reference.

FIELD

The present disclosure relates generally to interconnects and methods of manufacturing the same.

BACKGROUND

Back-end-of-line (BEOL) interconnects are utilized in integrated circuits to interconnect the individual devices of the circuit (e.g., transistors) together, and for making chip-to-package connections.

The BEOL interconnects include lines (or wires) and vias (i.e., plugs that connect networks of lines to one another vertically). The lines connect the devices of the circuit horizontally, and the vias make the connections vertically. The electrical resistance of the BEOL interconnects include the electrical resistance of the lines and that of the vias. For ultra-scaled line widths, such as interconnects having a critical dimension of 10-20 nm, the electrical resistance of the vias may become a significant source of electrical resistance in the interconnects, particularly at high via densities at less than or equal to 5 nm nodes.

There remains a need to reduce the electrical resistance of the vias.

The above information in the Background section is only for enhancement of understanding of the background of the technology and therefore it should not be construed as admission of existence or relevancy of the prior art.

SUMMARY

According to an embodiment of the present disclosure, an interconnect for an integrated circuit includes an interlayer dielectric (ILD) layer having a trench, a barrier layer on the ILD layer and covering a wall of the trench, and a conductive metal layer on the barrier layer and inside the trench. The barrier layer includes an alloy, the alloy including an interconnect barrier material and a dopant element. A density of states of the alloy may be at least 50% greater than a density of states of the interconnect barrier material.

In the alloy, the dopant element may be doped in the interconnect barrier material interstitially and/or substitutionally.

In one embodiment, the interconnect barrier material may include a 2D conductor selected from graphene, transition metal di-chalcogenides, black phosphorus and nitrides.

In one embodiment, the conductive metal may include Cu, and the interconnect barrier material may include at least one of $Ta_xN_y$ and $Ti_xN_y$.

In one embodiment, the conductive metal may include Ru, and the interconnect barrier material may include at least one of $Ti_xHf_yN_z$ and $Ti_xZr_yN_z$.

In one embodiment, the conductive metal may include Co, and the interconnect barrier material may include at least one of $Ta_xN_y$, $Ti_xN_y$, $Ti_xHf_yN_z$, and $Ti_xZr_yN_z$.

In one embodiment, the overall conductivity of the barrier layer may be greater than that of the interconnect barrier material.

In one embodiment, the interconnect barrier material may be TiN and the dopant element may be selected from Dy, Mo, Pt, Pd, Er, Si, B, Nb, W, Ta, Al, Zr and Hf.

In one embodiment, the density of states of the alloy may be 1 to 10 times greater than that of the interconnect barrier material and a vertical conductivity of the alloy may be greater than that of the interconnect barrier material.

In one embodiment, the dopant element may be distributed in the interconnect barrier material uniformly or non-uniformly throughout the whole thickness of the barrier layer.

In one embodiment, the dopant element may be more concentrated on a surface of the interconnect barrier material.

According to an embodiment of the present disclosure, a method of forming an interconnect for an integrated circuit includes: creating an ensemble of potential barrier structures, each of the potential barrier structure including an interconnect barrier material doped at a plurality of doping positions and a plurality of doping amounts for one of a plurality of potential dopant elements, calculating a density of states near the Fermi Level for each of the barrier structures of the ensemble, selecting a dopant element and a doping amount based on the density of states, and depositing a barrier layer including an alloy, the alloy including the interconnect barrier material and the selected dopant element at the selected doping amount. A density of states of the alloy may be at least 50% greater than a density of states of the interconnect barrier material.

In one embodiment, the calculating of the density of states may include detailed physics-based simulations or machine learning-based predictions on respective barrier structures. For example, the calculating of the density of states may be conducted utilizing at least one simulation program selected from first-principles based density functional theory atomistic simulations, a combination of first-principles based density functional theory simulations and predictive modeling utilizing machine learning models trained on data generated from simulations of the interconnect barrier material doped with a dopant, a combination of first-principles based density functional theory simulations and experimental information regarding conductivity of the interconnect barrier material in a presence of the dopant, and a combination of materials simulation and experimental data available in public and proprietary repositories.

In one embodiment, the depositing of the barrier layer may include: depositing the interconnect barrier material on an interlayer dielectric layer, and doping the interconnect barrier material with the selected dopant at the selected doping amount.

In one embodiment, the depositing of the interconnect barrier material may include utilizing one or more selected from Atomic Layer Deposition (ALD), Chemical Vapor Deposition (CVD), Physical Vapor Deposition (PVD), and Plasma-Enhanced ALD.

In one embodiment, the doping of the interconnect barrier material with the selected dopant element at the selected doping amount may include one or more selected from ion implantation and diffusion.

In one embodiment, the depositing of the barrier layer may include co-depositing the interconnect barrier material with the selected dopant element utilizing ALD, PVD, CVD, or PE-ALD.

In one embodiment, the interconnect barrier material may include a first atomic element, and the depositing of the barrier layer may include co-depositing the interconnect barrier material with a compound including the dopant element and the first atomic element.

In one embodiment, the interconnect barrier material may include $Ti_xN_y$, and the compound may include $Ta_xN_y$.

In one embodiment, the amount of compound may be selected to achieve the selected doping amount.

In one embodiment, the method may further include depositing an interlayer dielectric layer. The depositing of the barrier layer may include: depositing a monolayer of the dopant element on a surface of the interlayer dielectric layer, depositing the interconnect barrier material on the monolayer of the dopant element, and diffusing the dopant element into the interconnect barrier material to form the alloy. The depositing of the monolayer of the dopant element comprises a vapor-based or liquid-based deposition method. In one embodiment, the depositing of the monolayer of the dopant element comprises plating the monolayer of the dopant element utilizing a plating solution including the dopant element.

In one embodiment, the doping of the interconnect barrier material with the selected dopant element at the selected doping amount may include: exposing a surface of the interconnect barrier material to a gas including the dopant element, and reacting the surface of interconnect barrier material with the dopant element to form an alloy on the surface.

In one embodiment, the depositing of the barrier layer may include: depositing a first interconnect barrier material layer including the interconnect barrier material and the selected dopant element on an interlayer dielectric layer, depositing a second interconnect barrier material layer on the first interconnect barrier material layer, and reacting the first and second interconnect barrier material layers to form the alloy of the interconnect barrier material and the dopant element.

In one embodiment, the depositing of the barrier layer may include a dual-damascene flow where the interconnect barrier material may be co-deposited for via trench and interconnect line in the same Back-end-of-Line processing step.

In one embodiment, the depositing of the barrier layer may include a single damascene flow where the interconnect barrier material may be deposited in via trench and interconnect line in separate steps.

In one embodiment, the method further including depositing an interlayer dielectric layer, wherein the depositing of the barrier layer includes depositing the interconnect barrier material on the interlayer dielectric layer, plating a layer of the dopant element on the interconnect barrier material, and diffusing the dopant element into the interconnect barrier material to form the alloy.

According to embodiments of the present disclosure, the increase in density of states results in a decrease in mismatch between mode density in the conductive metal and the barrier material, thereby decreasing the resistivity of the conductive metal/barrier interface and the vertical resistivity of the conductive metal/barrier stack.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Figure 1:
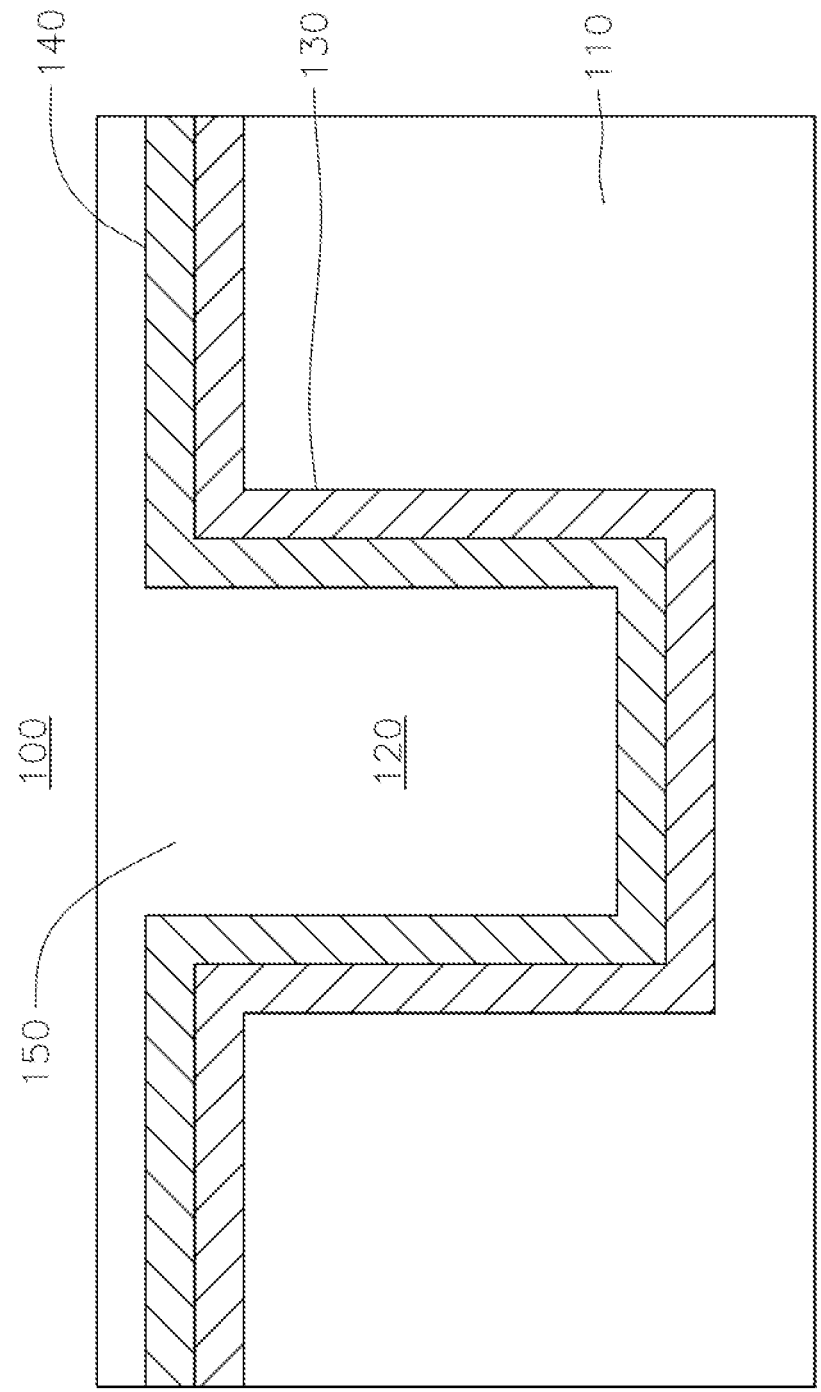
FIG. 1 is a cross sectional view of an interconnect according to an embodiment of the present disclosure.

The present disclosure is directed to various embodiments of interconnects for integrated circuits and methods of manufacturing the same. The interconnects of the present disclosure include an interconnect barrier layer formed of an alloy of an interconnect barrier material and a dopant element, which has improved electrical conductivity compared to related art interconnects without the alloy.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

According to an embodiment of the present disclosure, an interconnect for an integrated circuit includes an interlayer dielectric (ILD) layer having a trench, a barrier layer on the ILD layer and covering a wall of the trench, and a conductive metal layer on the barrier layer and inside the trench. The barrier layer includes an alloy, which includes an interconnect barrier material alloyed with a dopant element. The dopant element includes an atomic species. A density of states of the alloy is greater than a density of states of the interconnect barrier material. Further, the conductivity (e.g., vertical conductivity) of the alloy is greater than the conductivity (e.g., vertical conductivity) of the interconnect barrier material, when utilized to form the barrier layer respectively. In one embodiment, a liner layer may be included between the barrier layer and the conductive metal layer.

As used herein, the term "density of states" or "DOS" refers to the number of different states at a particular energy level that electrons are allowed to occupy, i.e., the number of electron states per unit volume at a given energy. As known to those skilled in the relevant art, the density of states can be derived from basic quantum mechanics. A high density of states at a specific energy level means that there are many states available for occupation.

FIG. 1 is a cross sectional view of an interconnect according to an embodiment of the present disclosure.

Referring to FIG. 1, an interconnect 100 for an integrated circuit includes an interlayer dielectric (ILD) layer 110 having a trench 120, a barrier layer 130 on the ILD layer 110 and covering a wall of the trench 120, a liner layer 140 on the barrier layer 130, and a conductive metal layer 150 on the liner layer 140 and inside the trench 120.

The barrier layer 130 includes an alloy, which is an alloy of an interconnect barrier material and a dopant element. The dopant element includes an atomic species selected such that the density of states near the Fermi Level of the alloy is greater than that of the interconnect barrier material alone.

In one embodiment, the density of states within +/−kT (e.g., 1 kT) of the Fermi Level is utilized to account for thermal distribution of electrons. For example, the density of states of the alloy may be 50%, 75%, 100%, or 200%, greater than that of the interconnect barrier material alone.

Throughout this disclosure, the term "alloy" refers to a material where the dopant element is doped in the lattice structure of the interconnect barrier material interstitially or substitutionally. A mere lamination of a dopant element layer with an interconnect barrier material layer or a mere mixture of the dopant element with the interconnect barrier material without the interstitial or substitutional doping is not considered as an alloy.

In one embodiment, the density of states of the alloy may be 1 to 10 times greater than that of the interconnect barrier material and the vertical conductivity of the alloy may be greater than (e.g., 10%, 20%, 50%, or 100% greater than) that of the interconnect barrier material.

In one embodiment, in the alloy, the dopant element may be doped in the interconnect barrier material interstitially and/or substitutionally. The dopant element may be distributed uniformly throughout the barrier layer 130. However, embodiments of the present disclosure are not limited thereto. In one embodiment, the dopant element may be distributed or alloyed with the interconnect barrier material non-uniformly throughout the whole thickness of the barrier layer. In one embodiment, the dopant element may be more concentrated on a surface of the interconnect barrier material. That is, the concentration of the dopant element may be higher in a surface region of the barrier layer than in the bulk (or middle) region of the barrier layer.

The interconnect barrier material may include any suitable materials. In one embodiment, the interconnect barrier material may include a 2D conductor selected from graphene, transition metal di-chalcogenides (such as, but not limited to, $MoS_2$, $WS_2$, $MoSe_2$, $WSe_2$, $MoTe_2$, etc.), black phosphorus, and nitrides (such as $Ta_xN_y$, $Ti_xN_y$, $Ti_xHf_yN_z$, and $Ti_xZr_yN_z$). In one embodiment, the interconnect barrier material may be amorphous.

The conductive metal layer 150 may be formed from copper (Cu), cobalt (Co), ruthenium (Ru), aluminum (Al), tin (Sn), nickel (Ni), gold (Au), silver (Ag), and/or any other suitable electrically conductive material. In one embodiment, the conductive metal layer 150 may include Cu, Co, or Ru. The vertical resistivity of Cu may increase with scaling due to a variety of reasons, such as grain boundary scattering, liner layer interface scattering and/or interface roughness scattering. Co and Ru have shown promising vertical resistivity scaling and may be utilized as replacement for Cu, at least in lower levels of interconnect metallization where the effect of scaling is the most impactful.

The interconnect barrier material may be selected based on the conductive metal utilized in forming the conductive metal layer. In one embodiment, the conductive metal may include Cu, and the interconnect barrier material may include at least one of $Ta_xN_y$ and $Ti_xN_y$. In another embodiment, the conductive metal may include Ru, and the interconnect barrier material may include at least one of $Ti_xHf_yN_z$ and $Ti_xZr_yN_z$. In another embodiment, the conductive metal may include Co, and the interconnect barrier material may include at least one of $Ta_xN_y$, $Ti_xN_y$, $Ti_xHf_yN_z$, and $Ti_xZr_yN_z$. Here, the values of x, y and z may be suitably selected.

The dopant element may be selected based on the interconnect barrier material to increase the density of states of the interconnect barrier material. In one embodiment, the interconnect barrier material may be $Ti_xN_y$ and the dopant element may be selected from dysprosium (Dy), molybdenum (Mo), platinum (Pt), palladium (Pd), erbium (Er), silicon (Si), boron (B), niobium (Nb), tungsten (W), tantalum (Ta), aluminum (Al), zirconium (Zr) and hafnium (Hf). The dopant element may be different from the elements included in the interconnect barrier material. For example, the dopant element may be a metal element that is different from a metal element included in the interconnect barrier material.

The barrier layer 130 is a desirable element of BEOL interconnect technology. The barrier layer 130 blocks diffusion of the conductive metal in the conductive metal layer 150 into the underlying ILD layer 110 (also referred to as low-k dielectric matrix) and diffusion of oxygen into the conductive metal layer 150. Here, the barrier layer 130 serves the dual purposes of helping maintain conductor (i.e., conductive metal in the conductive metal layer) integrity and dielectric (i.e., dielectric material in the ILD layer) integrity. The liner layer 140 enables adhesion of the conductive metal layer 150 to the barrier layer 130 and to the trench 120 in damascene BEOL schemes. While FIG. 1 illustrates an interconnect including a liner layer 140, embodiments of the present disclosure are not limited thereto, and an interconnect may not include a liner layer. In one embodiment, the conductive metal layer 150 is formed directly on the barrier layer 130 without the liner layer 140 therebetween.

Figure 5:
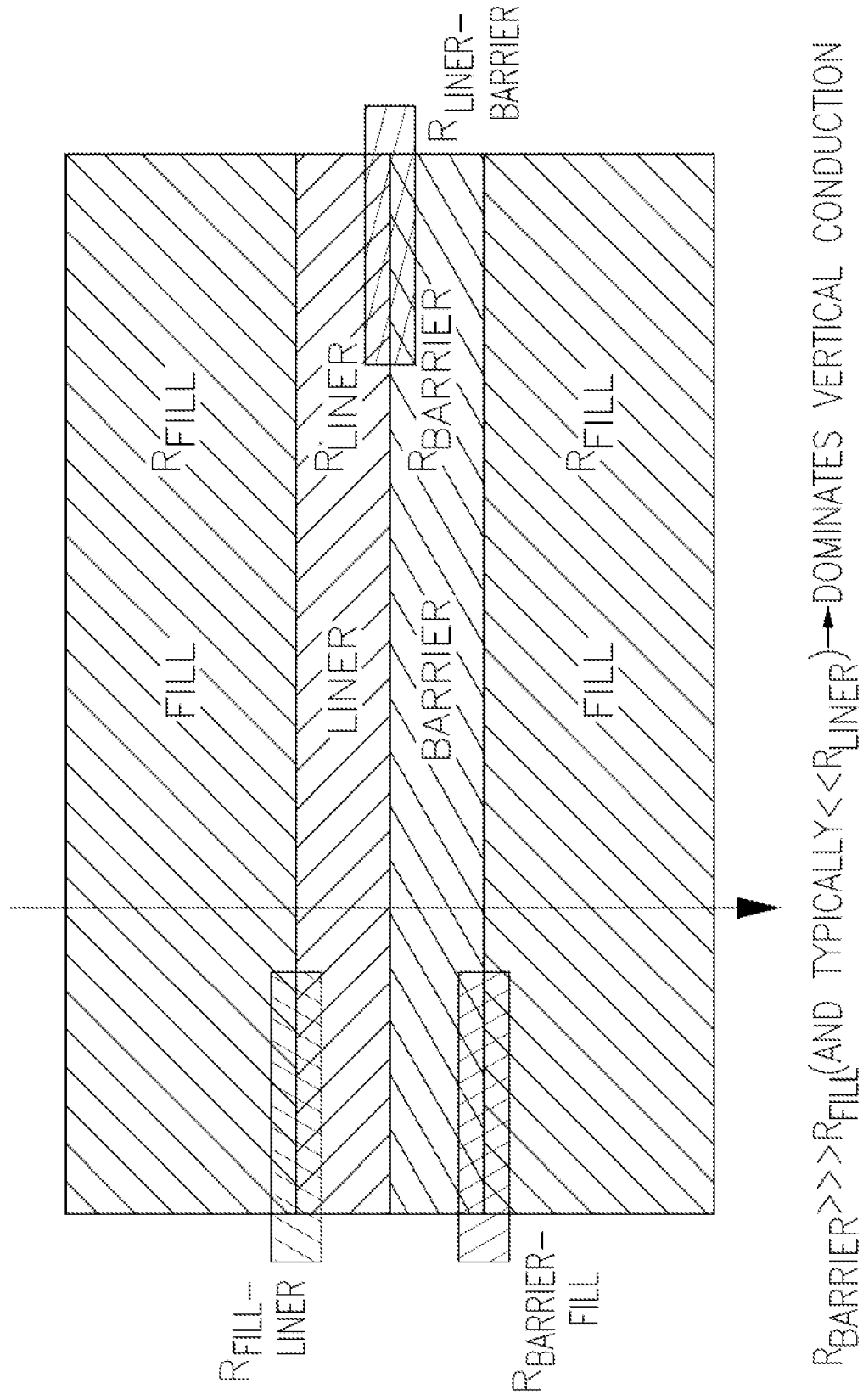
FIG. 5 is a schematic illustration of vertical conduction through an interconnect via.

FIG. 5 is a schematic illustration of conduction in an interconnect. Referring to FIG. 5, the BEOL total resistance can roughly be divided into its vertical (via) and horizontal (line) contributions. As scaling continues and density of vias continues to increase, via resistance contributes an increasingly large proportion of total BEOL resistance. At critical dimensions of 10-20 nm (expected in <=4 nm tech nodes), a reasonable via density of 4 vias per cell already contributes a resistance larger than line components. Therefore, reducing via resistance is taking on an increasingly important role in scaled technology nodes. Here, barrier resistance is the largest component of via resistance and reducing the barrier resistance by, e.g., one order of magnitude, will result in a large reduction in total BEOL resistance. According to embodiments of the present disclosure, the barrier resistance reduction is achieved through the formation of alloyed barriers that increases the density of states and reduces vertical resistivity of the barrier materials. The terms "vertical resistivity" and "vertical conductivity" as used herein refers to the electrical resistivity or conductivity in the direction of electron transport through the barrier layer in an interconnect, i.e., the direction as indicated by the arrow in FIG. 5. Also, the terms "fill" and "conductive metal" are used interchangeably in the present disclosure.

In related art, the vertical resistivity of the liner layer plus the barrier layer stack tends to be very high owing to the high vertical resistivity of materials suited to function as the barrier layer. In the semiconductor industry, nitrides such as TaN and TiN have conventionally been utilized as diffusion barriers. The vertical resistivity of these materials is typically two or more orders of magnitude more than the conductive metal (e.g., Cu, Co, or Ru). This results in an increase in the resistance of the interconnect (or the interconnect metal stack). The problem is more severe for vertical conduction through metal vias than it is for horizontal conduction along the length of interconnect lines. For vertical conduction (such as in a via), the barrier resistance is in series with the conductive metal layer resistance and the liner layer resistance, as shown in FIG. 5. Owing to the two or more orders of magnitude difference between the conductive metal layer and barrier material resistances, barrier resistance may dominate the vertical conduction.

According to embodiments of the present disclosure, the barrier layer 130 includes an alloy of an interconnect barrier material and a dopant element, which includes an atomic species. The dopant element is selected such that the density of states of the alloy is greater than the density of states of the interconnect barrier material alone. As such, the conductivity of the barrier layer is greater than that of the interconnect barrier material alone, and the total resistance for the vertical conduction is thereby reduced.

According to an embodiment of the present disclosure, a method for forming an interconnect for an integrated circuit includes: creating an ensemble of potential barrier structures, each of the potential barrier structure comprising an interconnect barrier material doped at a plurality of doping positions and a plurality of doping amounts for one of a plurality of potential dopant elements, calculating a density of states near the Fermi Level for each of the barrier structures of the ensemble, selecting a dopant element and a doping amount based on the density of states, and depositing a barrier layer including an alloy, the alloy including the interconnect barrier material and the selected dopant element at the selected doping amount.

Figure 2:
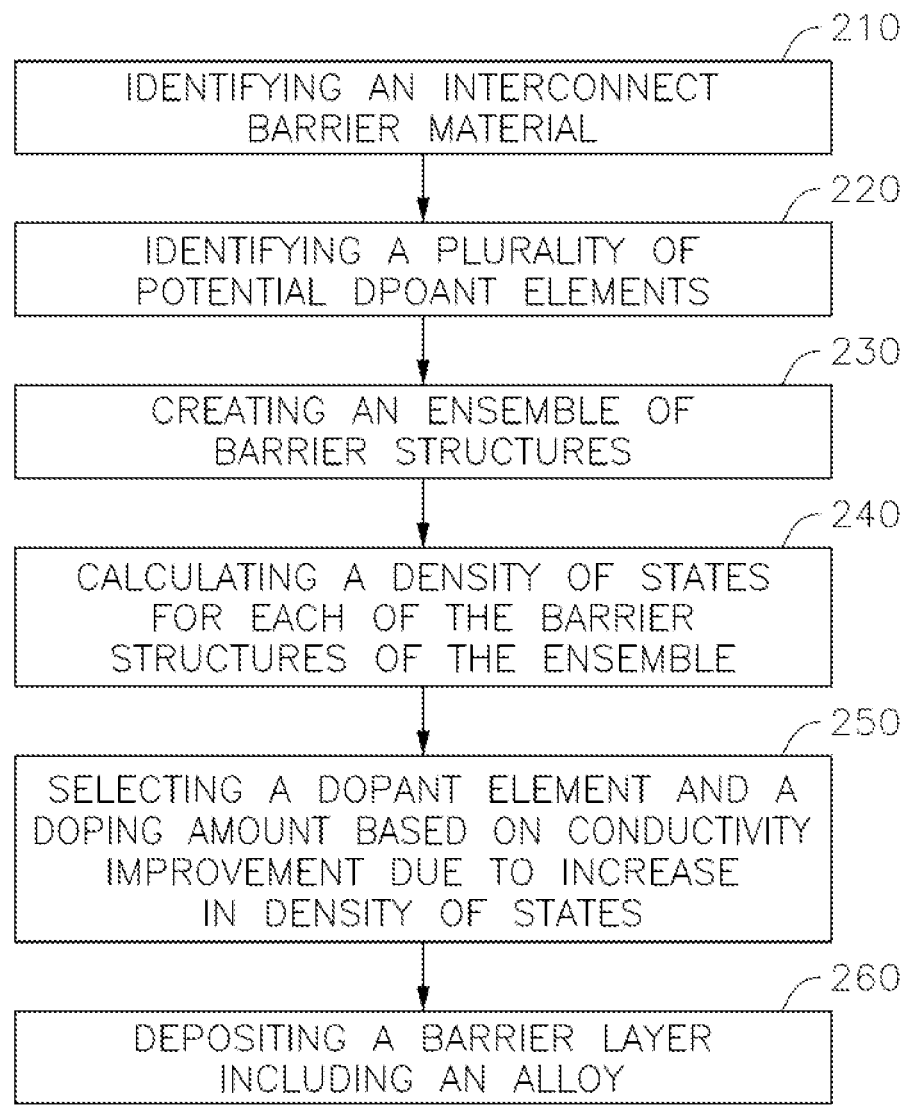
FIG. 2 is a flow chart illustrating a process of manufacturing an interconnect for an integrated circuit.

FIG. 2 is a flow chart illustrating a process of manufacturing an interconnect for an integrated circuit.

Referring to FIG. 2, the process of manufacturing an interconnect for an integrated circuit includes act 210, identifying an interconnect barrier material, act 220, identifying a plurality of potential dopant elements, act 230, creating an ensemble of potential barrier structures including the interconnect barrier material doped at a plurality of doping positions and a plurality of doping amounts for each of the plurality of potential dopant elements, and act 240, calculating a density of states for each of the barrier structures of the ensemble.

The interconnect barrier material may include any suitable materials. In one embodiment, the interconnect barrier material may be selected from a 2D conductor selected from graphene, transition metal di-chalcogenides, black phosphorus and nitrides.

In one embodiment, the interconnect barrier material may be amorphous. The interconnect barrier material may be selected based on the conductive metal utilized in forming the conductive metal layer. In one embodiment, the conductive metal may include Cu, and the interconnect barrier material may include at least one of $Ta_xN_y$ and $Ti_xN_y$. In one embodiment, the conductive metal may include Ru, and the interconnect barrier material may include at least one of $Ti_xHf_yN_z$ and $Ti_xZr_yN_z$. In one embodiment, the conductive metal may include Co, and the interconnect barrier material may include at least one of $Ta_xN_y$, $Ti_xN_y$, $Ti_xHf_yN_z$, and $Ti_xZr_yN_z$.

In act 220, a plurality of potential dopant elements may be identified or selected. There are no particular limitations in the selection of the potential dopant elements as long as it does not have undesirable effects on the barrier layer, the ILD layer, the liner layer and the conductive metal layer. In other words, after the identification of the interconnect barrier material, any elements on the periodic table that do not have the undesirable effects may be identified as a potential dopant element.

In act 230, an ensemble of potential barrier structures are created. The ensemble of potential barrier structures includes the interconnect barrier material doped at a plurality of doping positions and a plurality of doping amounts for each of the plurality of potential dopant elements. The plurality of doping positions may include any suitable position that the dopant element may be included in the lattice structure of the interconnect barrier material. Further, the plurality of doping amounts may include any suitable amount, e.g., from 0.1% to 100% (fully saturated amount). In each of the potential barrier structures, a selected potential dopant element is doped at selected position(s) of the interconnect barrier material at a selected amount.

For example, TiN may be selected as the interconnect barrier material, and Mo may be selected as one of the potential dopant elements. One of the potential barrier structures may be substituting one Ti atom or one N atom with one Mo atom from among TiN molecules. Another potential barrier structure may be substituting two Ti atoms or two N atoms with two Mo atoms from among 10 TiN molecules. The ensemble of potential barrier structures for TiN may include any element from the periodic table, and may be created and stored in a computing device.

In act 240, the calculation of the density of states for each of the barrier structures of the ensemble may be conducted utilizing a computer program. For example, the calculation may utilize at least one simulation program selected from first-principles based density functional theory atomistic simulations, a combination of first-principles based density functional theory simulations and predictive modeling utilizing machine learning models trained on data generated from simulations of the interconnect barrier material doped with a dopant, a combination of first-principles based density functional theory simulations and experimental information regarding conductivity of the interconnect barrier material in a presence of the dopant, and a combination of materials simulation and experimental data available in public and proprietary repositories. For example, the public and proprietary repositories may include any suitable ones, such as Materials Project, Inorganic Crystal Structure Database (ICSD), AFlowLib, NOMAD, Citrine, and Materials Platform for Data Science (MPDS), among others.

The calculation may be carried out on a computer suitable for fast calculations.

The process further includes act 250, selecting a dopant element and a doping amount based on conductivity improvement due to increase in density of states. Here, the dopant element and the doping amount may be selected to have a greater conductivity due to an increased density of states for the barrier structure than the interconnect barrier material alone. Among the dopant elements that provide increased conductivity and density of states for the barrier structure, the selection may also consider the availability of the dopant element and the processability of the dopant element.

Figure 3:
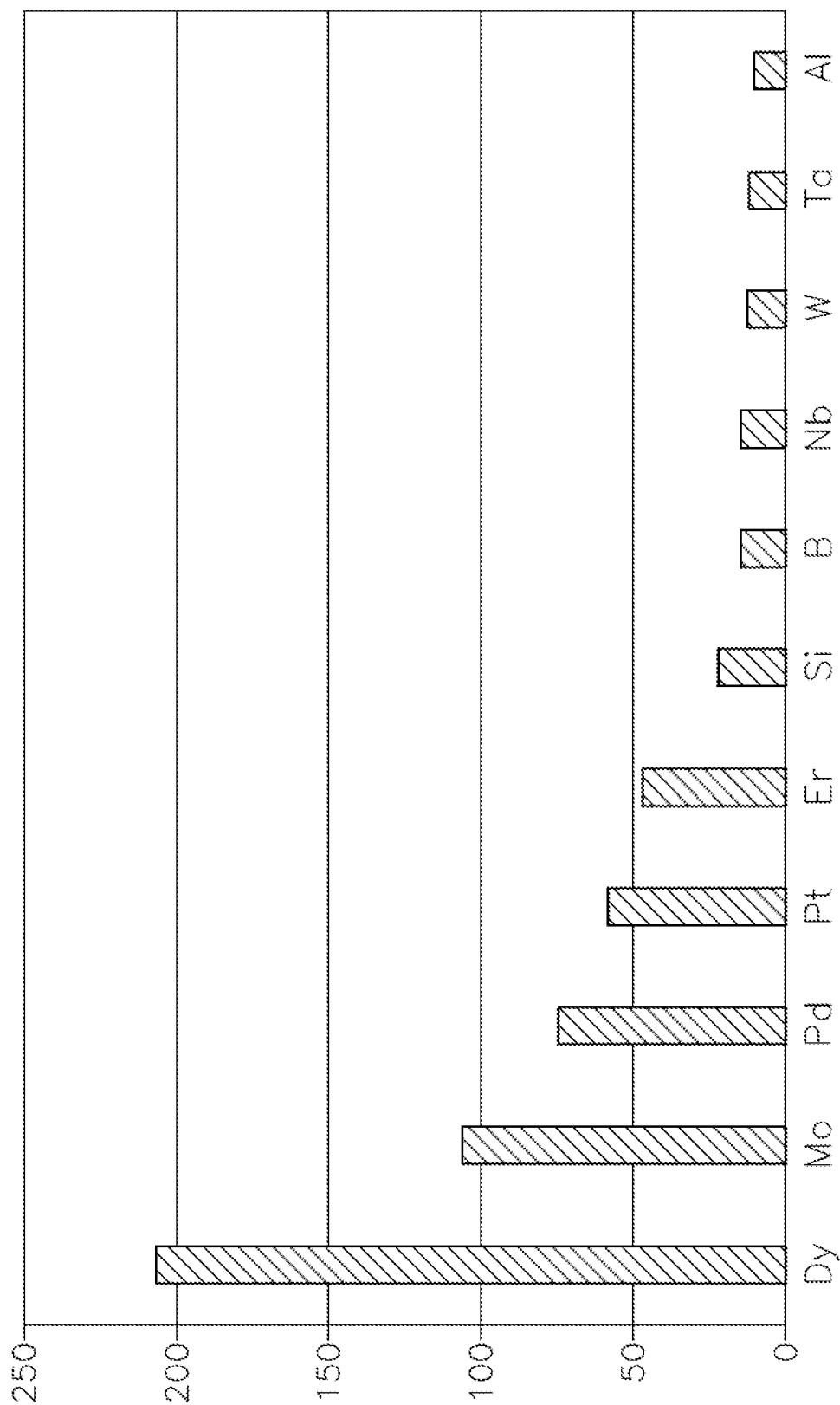
FIG. 3 is a plot showing the percent improvement of density of states of TiN when doped with various dopant elements.

FIG. 3 is a plot showing the percent improvement of density of states of TiN when doped with various dopant elements, utilizing first principles computation of density of states. The dopants are included at 8.3 mole % based on 100 mole % of Ti. As shown in FIG. 3, doping TiN with Dy results in an over 200% increase in the density of states, and doping TiN with Mo results in an over 100% increase in the density of states. Furthermore, doping with Al, Ta, W, Nb and B all result in significant increase in the density of states. From here, a dopant element may be selected, such as Er, Pt, Pd, Mo or Dy. While specific elements are shown in FIG. 3, embodiments of the present disclosure are not limited thereto, and various additional elements may be utilized to dope TiN, as long as it increases the density of states and improves the vertical conductivity.

Figure 6:
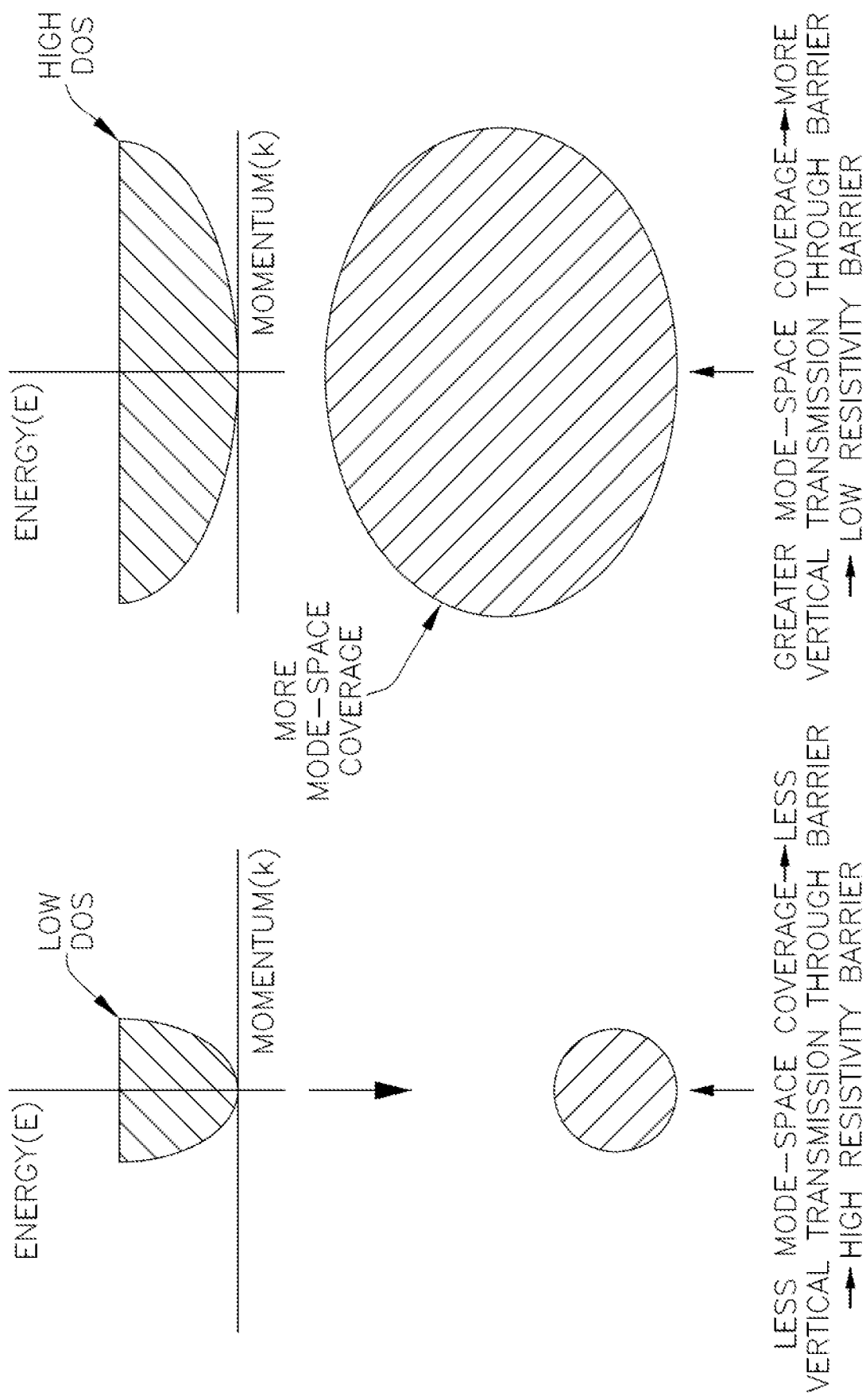
FIG. 6 is a schematic representation of an increase in mode-space coverage due to increase in density of states.

FIG. 6 is a schematic representation of an increase in mode-space coverage due to increase in density of states according to embodiments of the present disclosure. As shown in FIG. 6, when the density of states is low, it allows less mode-space coverage, which leads to less vertical transmission through the barrier layer. Accordingly, the barrier layer has higher vertical resistivity and lower vertical conductivity. However, when the density of states is increased to a greater value through alloying, it allows more mode-space coverage, and more vertical transmission through the barrier layer. Accordingly, the barrier layer has lower vertical resistivity and higher vertical conductivity. Here, the alloying elements are chosen to increase the barrier conductivity by increasing the density of states of the barrier material, which leads to increased mode-space coverage in the barrier layer. Further, the improvement in conductivity according to embodiments of the present disclosure is not limited by the specific conductive metal utilized in forming the interconnect. As such, the method according to embodiments of the present disclosure can be utilized to form low vertical resistivity barrier materials from existing barrier materials for any given (e.g., arbitrary) conductive metal materials.

The process further includes act 260, depositing a barrier layer including an alloy, the alloy including the interconnect barrier material and the selected dopant element at the selected doping amount.

The deposition of the barrier layer may include: depositing the interconnect barrier material on a dielectric substrate (e.g., an interlayer dielectric layer), and doping the interconnect barrier material with the selected dopant at the selected doping amount. The interconnect barrier material may be deposited utilizing one or more techniques selected from Atomic Layer Deposition (ALD), Chemical Vapor Deposition (CVD), Physical Vapor Deposition (PVD), and Plasma-Enhanced ALD (PE-ALD).

Figure 4:
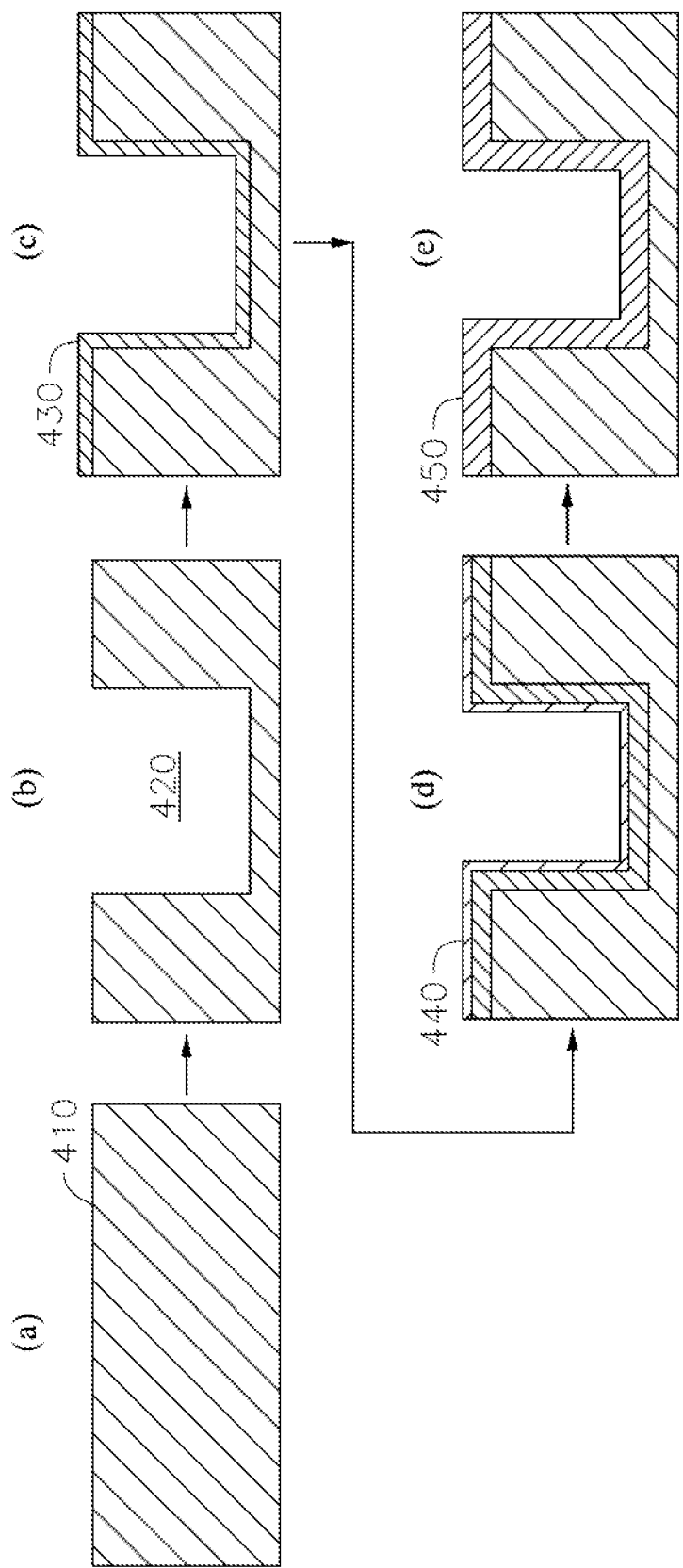
FIG. 4 is a schematic illustration of an example process of depositing a barrier layer including the low resistance alloy.

FIG. 4 is a schematic illustration of an example process of depositing a barrier layer including the alloy.

Referring to FIG. 4, the process of depositing the barrier layer including the alloy includes depositing an interlayer dielectric (ILD) layer 410 in act (a), etching the ILD layer 410 to form a trench 420 in act (b), depositing an interconnect barrier material 430 on the ILD layer 410 and inside the trench 420 in act (c), depositing a dopant element 440 in act (d), and reacting the interconnect barrier material 430 and the dopant element 440 to form the barrier layer 450 including the alloy of the interconnect barrier material and the dopant element.

While separate deposition of an interconnect barrier material and a dopant element is illustrated in FIG. 4, embodiments of the present disclosure are not limited thereto, and the barrier layer may be formed utilizing any suitable methods. In one embodiment, the alloy may be formed by doping the interconnect barrier material with the selected dopant element utilizing ion implantation and/or diffusion.

In one embodiment, the depositing of the barrier layer may include co-depositing the interconnect barrier material with the selected dopant element utilizing ALD, PVD, CVD, or PE-ALD.

In one embodiment, the interconnect barrier material may include a first atomic element, and the depositing of the barrier layer may include co-depositing the interconnect barrier material with a compound including both the dopant element and the first atomic element. For example, the interconnect barrier material may include $Ti_xN_y$, and the compound may include $Ta_xN_y$ to provide a barrier layer including an alloy of TiN with Ta. The amount of $Ta_xN_y$ may be suitably adjusted to provide the desired amount of doping.

In one embodiment, the depositing of the barrier layer may include depositing an interlayer dielectric layer, depositing a monolayer of the dopant element on a surface of the interlayer dielectric, and then depositing the interconnect barrier material on the monolayer of the dopant element, followed by diffusing the dopant element into the interconnect barrier material to form the alloy. The diffusing of the dopant element into the interconnect barrier material to form the alloy may be conducted at a suitable condition, such as through heat treatment. The depositing of the monolayer of the dopant element may include a vapor-based and/or liquid-based deposition method. In one embodiment, the depositing of the monolayer of the dopant element includes electroplating the monolayer of the dopant element utilizing a plating solution including the dopant element.

In one embodiment, the interlayer dielectric layer may be deposited and patterned utilizing standard lithography and etching techniques to form the via (single Damascene) or the via and trench (dual Damascene). Then the interconnect barrier material may be deposited on the interlayer dielectric layer utilizing a suitable deposition technique. Afterwards, the dopant element may be added utilizing a plating process, and allowed to alloy with the underlying interconnect barrier material. A seed layer for the conductive metal layer may be deposited on the barrier layer, utilizing, e.g., physical vapor deposition (PVD) or electroplating, and the conductive metal layer may be deposited on the seed layer. In one embodiment, the dopant element and the seed layer are deposited concurrently through an electroplating process. In another embodiment, the dopant element is deposited utilizing an electroplating process prior to the deposition of the seed layer.

In one embodiment, the depositing of the barrier layer may include: after deposition of the interconnect barrier material, exposing a surface (e.g., a top surface) of the interconnect barrier material to a gas including the dopant element, and reacting the surface of interconnect barrier material with the dopant element to form an alloy on the surface.

In one embodiment, the depositing of the barrier layer may include: depositing a first interconnect barrier material layer including the interconnect barrier material and the selected dopant element on a dielectric substrate (e.g., interlayer dielectric layer), depositing a second interconnect barrier material layer on the first interconnect barrier material layer, and reacting the first and second interconnect barrier material layers to form the alloy of the interconnect barrier material and the dopant element. The reacting of the first and second interconnect barrier material layers to form the alloy of the interconnect barrier material and the dopant element may be conducted at a suitable condition, such as through heating.

In one embodiment, the depositing of the barrier layer may include a dual-damascene flow where the interconnect barrier material may be co-deposited for via trench and the interconnect line in the same Back-end-of-Line processing step.

In one embodiment, the deposition of the barrier layer may include a single damascene flow where the interconnect barrier material may be deposited in via trench and interconnect line in separate steps.

In one embodiment, the depositing of the interconnect barrier material may include: depositing a crystalline interconnect barrier material, and rapidly melting-and-quenching or laser annealing the crystalline interconnect barrier material to form an amorphous interconnect barrier material.

In embodiments of the present disclosure, the increase in density of states results in a decrease in mismatch between mode density in the conductive metal layer and the barrier layer, thereby decreasing the vertical resistivity of the conductive metal layer/barrier layer interface and the vertical resistivity of the conductive metal layer/barrier layer stack.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. An interconnect for an integrated circuit, comprising:
    an interlayer dielectric (ILD) layer having a trench, the trench having a bottom and a wall surrounding the bottom,
    a barrier layer on the ILD layer and covering the bottom and the wall of the trench, and
    a conductive metal layer on the barrier layer and inside the trench,
    wherein the barrier layer comprises an alloy, the alloy comprising an interconnect barrier material and a dopant element,
    wherein a density of states of the alloy is at least 50% greater than a density of states of the interconnect barrier material, and
    wherein in the alloy, the dopant element is doped in the interconnect barrier material interstitially and/or substitutionally.

2. The interconnect of claim 1, wherein the interconnect barrier material comprises a 2D conductor selected from graphene, transition metal di-chalcogenides, black phosphorus and nitrides.

3. The interconnect of claim 1, wherein an overall conductivity of the barrier layer is greater than that of the interconnect barrier material.

4. The interconnect of claim 1, wherein the interconnect barrier material comprises TiN and the dopant element comprises at least one selected from Dy, Mo, Pt, Pd, Er, Si, B, Nb, W, Ta, Zr and Hf.

5. The interconnect of claim 1, wherein the density of states of the alloy is 1 to 10 times greater than that of the interconnect barrier material and a vertical conductivity of the interconnect is greater than that of a same interconnect except for including only the barrier material in the barrier layer.

6. The interconnect of claim 1, wherein the dopant element is distributed in the interconnect barrier material non-uniformly throughout a whole thickness of the barrier layer.

7. The interconnect of claim 6, wherein the dopant element is more concentrated on a surface of the interconnect barrier material.

8. The interconnect of claim 1, wherein the dopant element is distributed in the interconnect barrier material uniformly throughout a whole thickness of the barrier layer.

* * * * *